US008599622B2

(12) United States Patent
Kim et al.

(10) Patent No.: US 8,599,622 B2
(45) Date of Patent: Dec. 3, 2013

(54) CHARGE TRAP FLASH MEMORY DEVICE AND AN ERASING METHOD THEREOF

(75) Inventors: Juhyung Kim, Yongin-si (KR); Changseok Kang, Seongnam-si (KR); Hansoo Kim, Suwon-si (KR); Byeong-In Choe, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 159 days.

(21) Appl. No.: 13/176,950

(22) Filed: Jul. 6, 2011

(65) Prior Publication Data

US 2012/0033503 A1    Feb. 9, 2012

(30) Foreign Application Priority Data

Aug. 9, 2010 (KR) .................. 10-2010-0076536

(51) Int. Cl.
*G11C 11/34* (2006.01)

(52) U.S. Cl.
USPC .................................................. 365/185.29

(58) Field of Classification Search
USPC .................................................. 365/185.29
See application file for complete search history.

(56) References Cited

U.S. PATENT DOCUMENTS

| 7,184,313 B2* | 2/2007 | Betser et al. | 365/185.24 |
| 2009/0303799 A1* | 12/2009 | Nakamura | 365/185.22 |
| 2010/0172186 A1* | 7/2010 | Lee et al. | 365/185.19 |
| 2010/0232235 A1* | 9/2010 | Goda | 365/185.26 |
| 2010/0259962 A1* | 10/2010 | Yan et al. | 365/51 |

FOREIGN PATENT DOCUMENTS

| JP | 2002-184192 | 6/2002 |
| JP | 2002-367382 | 12/2002 |
| JP | 2004-071077 | 3/2004 |

* cited by examiner

*Primary Examiner* — Hoai V Ho
*Assistant Examiner* — Min Huang
(74) *Attorney, Agent, or Firm* — F. Chau & Associates, LLC

(57) ABSTRACT

An erase method of a charge trap flash memory device, the method including receiving a temperature detection result, and performing an erase operation based on the temperature detection result, wherein the erase operation includes an erase execution interval, an erase verify interval and a delay time between the erase execution interval and the erase verify interval, wherein the erase operation changes a level of a word line voltage applied to word lines during the erase execution interval, a length of the delay time, or a level of the word line voltage applied to the word lines during the delay time.

16 Claims, 13 Drawing Sheets

CHARGE TRAP FLASH MEMORY DEVICE AND AN ERASING METHOD THEREOF

CROSS-REFERENCE TO RELATED APPLICATION

This U.S. non-provisional patent application claims priority under 35 U.S.C. §119 to Korean Patent Application No. 10-2010-0076536, filed Aug. 9, 2010, the disclosure of which is incorporated by reference herein in its entirety.

BACKGROUND

1. Technical Field

The present inventive concept relates to nonvolatile memory devices, and more particularly, to a charge trap flash memory device using an insulation layer as a charge storage layer and an erasing method thereof.

2. Discussion of the Related Art

Flash memory is a non-volatile memory device that can be electrically erased and programmed A flash memory cell is made of a floating gate transistor that includes a floating gate electrically isolated between a control gate and a channel. A flash memory cell may store bit information by injecting an electric charge into a conductive floating gate insulated with an insulation layer. However, unwanted charges may migrate to the floating gate, due to capacitive coupling between memory cells or between a memory cell and a selection transistor, thus causing the stored electric charge to change. Further, the capacitive coupling may worsen as flash memories increase their degree of integration. To alleviate the effects of capacitive coupling between conductive floating gates, a charge storage layer of $Si_3N_4$, $Al_2O_3$, HfAlO, or HfSiO (e.g., a layer having a charge trap site) may be used in place of a conductive floating gate. A flash memory employing such a charge storage layer in its cells is called a charge trap flash (CTF) memory.

The CTF memory has a transient characteristic in which after a program or erase voltage is applied for a program or erase operation, electrons/holes in a charge storage layer become stabilized in terms of energy such that the injection/emission of the electrons/holes to/from the charge storage layer does not occur. According to the transient characteristic, a CTF memory cell may have a threshold voltage Vth that becomes stable after a predetermined time elapses from the time when a program or erase voltage is applied to the CTF memory.

The transient characteristic of the CTF memory may be changed according to external influences such as temperature, humidity, pressure, and electromagnetic force. For example, the transient characteristic of the CTF memory is dependent on a change in temperature. Therefore, a time for stabilizing electrons/holes in a charge storage layer is closely related to a time consumed by program and erase operations and consequently whether an error occurs or not.

For example, when the CTF memory operates at a cold temperature below that of its verified operating range, a time for stabilizing electrons/holes in a charge storage layer may change. Accordingly, an erase verify operation may be performed prior to stabilization is secured and therefore, an error occurrence frequency of an erase operation may be increased. This may cause malfunctions of the CTF memory and may deteriorate data reliability. Further, the increase of errors in an erase operation increases the number of repetitions of an erase loop, such that a high voltage stress (e.g., an erase voltage of 20V) applied to the CTF memory is increased. Further, the increased high voltage stress applied to the CTF memory also shortens the life span thereof.

Accordingly, there is a need for the CTF memory to properly operate in temperature extremes outside its verified operating rage.

SUMMARY

An exemplary embodiment of the present inventive concept provides a charge trap flash memory device with high erase accuracy and stable performance while operating in cold temperatures and an erasing method thereof.

An exemplary embodiment of the present inventive concept provides a charge trap flash memory device, which reduces chip stress applied during an erase operation at cold temperatures and increases the life of the chip, and an erasing method thereof.

An exemplary embodiment of the inventive concept provides an erase method of a charge trap flash memory device, wherein the method includes: receiving a temperature detection result; and performing an erase operation based on the temperature detection result, wherein the erase operation includes an erase execution interval, an erase verify interval and a delay time between the erase execution interval and the erase verify interval, wherein the erase execution interval changes a level of a word line voltage applied to word lines during the erase execution interval, a length of the delay time, or a level of the word line voltage applied to the word lines during the delay time.

In an exemplary embodiment of the inventive concept, changing the length of the delay time may include increasing the length of the delay time in response to the temperature detection result being lower than a reference voltage.

In an exemplary embodiment of the inventive concept, the length of the delay time may increase as the temperature detection result decreases.

In an exemplary embodiment of the inventive concept, changing the level of the word line voltage applied to the word lines during the delay time may include applying a counter pulse to the word lines during the delay time in response to the temperature detection result being lower than a reference voltage.

In an exemplary embodiment of the inventive concept, an applying time and a voltage level of the counter pulse may be changed according to the temperature detection result.

In an exemplary embodiment of the inventive concept, an applying time of the counter pulse may increase as the temperature detection result decreases.

In an exemplary embodiment of the inventive concept, a voltage level of the counter pulse may increase as the temperature detection result decreases.

In an exemplary embodiment of the inventive concept, the counter pulse may form an electric field in a direction opposite to a direction of an electric field formed in the erase execution interval.

In an exemplary embodiment of the inventive concept, changing the level of the word line voltage applied to the word lines during the erase execution interval may include applying a negative voltage to the word lines during the erase execution interval in response to the temperature detection result being lower than a reference voltage.

In an exemplary embodiment of the inventive concept, an applying time and a voltage level of the negative voltage may be changed according to the temperature detection result.

In an exemplary embodiment of the inventive concept, an applying time of the negative voltage may increase as the temperature detection result decreases.

In an exemplary embodiment of the inventive concept, the negative voltage may be increased in a negative direction as the temperature detection result decreases.

In an exemplary embodiment of the inventive concept, the temperature detection result may be inputted from the outside of the charge trap flash memory device or internally generated by the charge trap flash memory device.

In an exemplary embodiment of the inventive concept, a charge trap flash memory device includes: a memory cell array including a plurality of memory cells, wherein a memory cell uses an insulation layer as a charge storage layer; and a control logic controls an erase operation in response to a temperature detection result, wherein the erase operation includes an erase execution interval, an erase verify interval and a delay time between the erase execution interval and the erase verify interval, wherein the erase operation changes a level of a word line voltage applied to word lines connected to memory cells to be erased during the erase execution interval, a length of the delay time, or a level of the word line voltage applied to the word lines during the delay time.

In an exemplary embodiment of the inventive concept, the control logic may control the length of the delay time to increase when the temperature detection result is lower than a reference voltage.

In an exemplary embodiment of the inventive concept, the control logic may control the level of the word line voltage applied to the word lines during the delay time by causing a counter pulse to be applied to the word lines during the delay time when the temperature detection result is lower than a reference voltage; and the counter pulse may form an electric field in a direction opposite to a direction of an electric field formed in the erase execution interval.

In an exemplary embodiment of the inventive concept, the control logic may control the level of the word line voltage applied to the word lines during the erase execution interval by causing a negative voltage to be applied to the word lines during the erase execution interval when the temperature detection result is lower than a reference voltage.

In an exemplary embodiment of the inventive concept, the memory cell array may include a stacked flash structure in which a plurality of memory cell arrays are stacked in a plurality of layers, a flash structure without a source and a drain, a pin-type flash structure, or a three-dimensional flash structure.

In an exemplary embodiment of the inventive concept, an erase method of a non-volatile memory device is provided, the method including: performing a first erase operation in response to a temperature signal being outside of a predetermined range, wherein, in the first erase operation, a plurality of memory cells of the non-volatile memory device are erased, and the first erase operation changes at least one of a plurality of preset erase conditions.

The method may include performing a second erase operation in response to the temperature signal being within the predetermined range, wherein the second erase operation does not change any of the preset erase conditions.

BRIEF DESCRIPTION OF THE DRAWINGS

The above and other features of the inventive concept will become more apparent by describing in detail exemplary embodiments thereof with reference to the attached drawings, in which.

DETAILED DESCRIPTION OF THE EMBODIMENTS

Exemplary embodiments of the inventive concept will be described below in more detail with reference to the accompanying drawings. However, the inventive concept may be embodied in different forms and should not be construed as limited to the embodiments set forth herein. For example, according to an exemplary embodiment of the inventive concept, an erase operation of a charge trap flash memory device at a cold temperature using a lower voltage than a predetermined reference voltage will be described. However, the charge trap flash memory device according to the inventive concept and an erasing method thereof are not limited to the operating environment of a specific cold temperature (e.g., a cold temperature slightly below the verified operating temperature of the memory device) and may be applied to various kinds of operating environment temperatures (e.g., an extremely cold temperature far below the verified operating temperature of the memory device or a hot temperature well above the verified operating temperature of the memory device).

The charge trap flash memory device according to an exemplary embodiment of the inventive concept may switch between a normal erase operation and a modified erase operation in which certain erase operation conditions are changed (for example, the length of delay time, a counter pulse, and a level of a word line voltage applied during an erase operation) based on a temperature detection result. As a result, even when the stabilizing time of electrons/holes is changed due to an operating environment of a cold temperature, an erase verify error may be reduced and high erase accuracy and stable performance may be secured. The reduction of the erase verify error may decrease the number of repetitions of an erase loop and may increase the useful life of a charge trap flash memory device. Further, according to an exemplary embodiment of the inventive concept, a change to the condition of an erase operation may be performed only when a temperature detection result is less than a predetermined voltage, so that the flash memory device may operate at an optimized speed.

Figure 1:
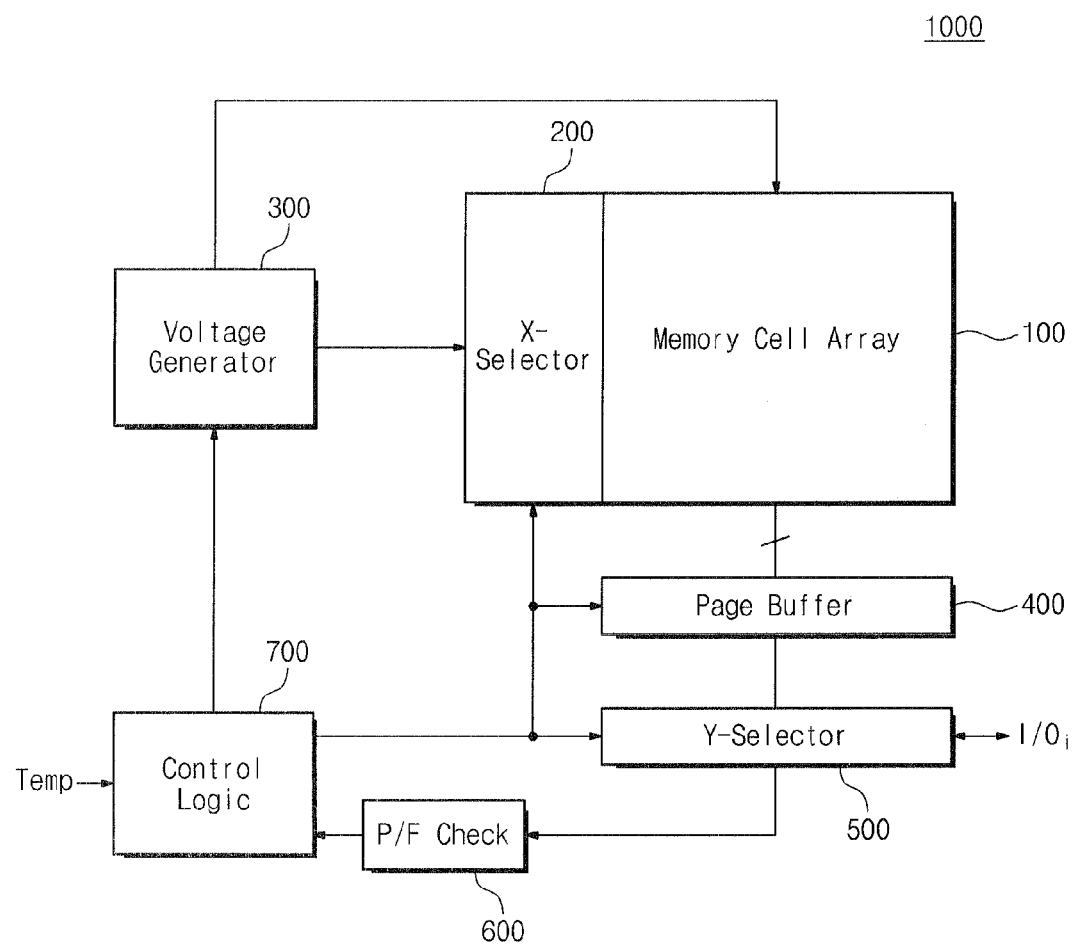
FIG. 1 is a block diagram illustrating a flash memory device according to an exemplary embodiment of the inventive concept.
Figure 2:
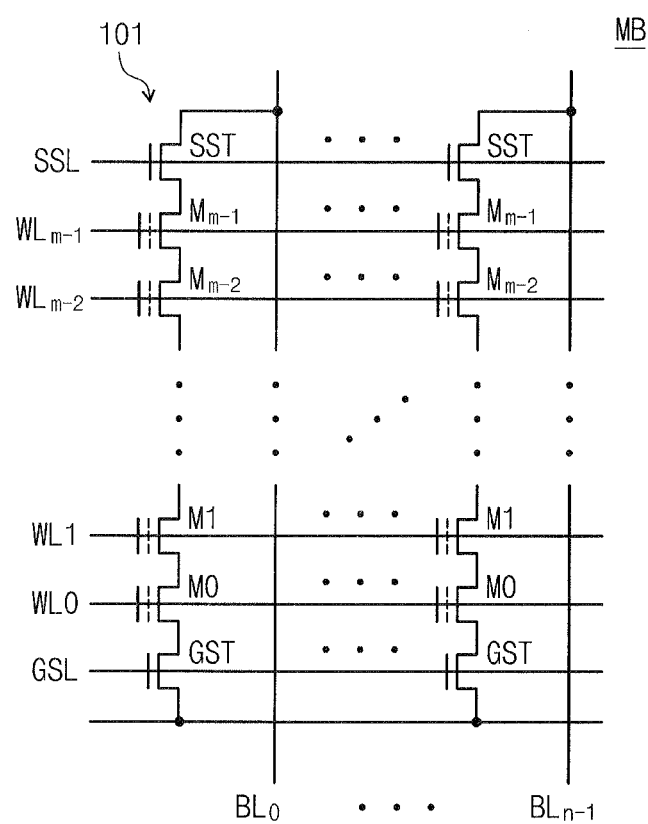
FIG. 2 is a circuit diagram illustrating an exemplary configuration of a memory cell array shown in FIG. 1.

FIG. 1 is a block diagram illustrating a flash memory device 1000 according to an exemplary embodiment of the inventive concept. FIG. 2 is a circuit diagram illustrating an exemplary configuration of a memory cell array 100 shown in FIG. 1. The flash memory device 1000 is a charge trap flash (CTF) memory using an insulation layer of $Si_3N_4$, $Al_2O_3$, HfAlO, or HfSiO as a charge storage layer. However, the flash memory device 1000 is not limited to the CTF memory, nor is the CTF memory limited to the aforementioned insulation layers.

Referring to FIGS. 1 and 2, the flash memory device 1000 includes the memory cell array 100 for storing N-bit data information (N is an integer equal to or greater than 1). The memory cell array 100 may be divided into a main region for storing general data and a spare region for storing additional information (e.g., metadata) related to the general data. The memory cell array 100 includes memory cells arranged in a plurality of rows (or word lines) and a plurality of columns (or bit lines). A plurality of memory cells in the memory cell array 100 constitute a memory block MB and the memory cell array 100 includes a plurality of memory blocks MB. FIG. 2 illustrates a configuration of one of the plurality of memory blocks MB in the memory cell array 100.

Memory cells in each memory block may have a NAND string structure as shown in FIG. 2 or a NOR structure (not shown). For conciseness of description, a CTF memory having a NAND string structure is illustrated and will be described with reference to exemplary embodiments of the inventive concept.

Referring to FIG. 2, one memory block MB may include a plurality of strings 101 corresponding to a plurality of rows or bit lines $BL_0$ to $BL_{n-1}$, respectively. Each string 101 includes a string selection transistor SST, a plurality of memory cells M0 to $M_{m-1}$, and a ground selection transistor GST. In each string 101, a drain of the string selection transistor SST is connected to a corresponding bit line and a source of the ground selection transistor GST is connected to a common source line CSL. Moreover, the plurality of memory cells M0 to $M_{m-1}$ are connected in series between the source selection transistor SST and the drain of the ground selection transistor GST. Control gates of memory cells arranged in the same row are commonly connected to corresponding word lines WL0 to $WL_{m-1}$. The string selection transistor SST is controlled by a voltage applied through a string selection line SSL and the ground selection transistor GST is controlled by a voltage applied through a ground selection line GSL. Moreover, the memory cells M0 to $M_{m-1}$ are controlled by a voltage applied through the corresponding word lines WL0 to $WL_{m-1}$. Memory cells connected to each of the word lines WL0 to $WL_{m-1}$ store data corresponding to one page or a plurality of pages.

Here, the number and kind of the string selection transistors SST and the ground selection transistors GST in each string 101 may vary. For example, at least two string selection transistors SST and at least two ground selection transistors GST may be included in each string 101. Moreover, the string selection transistor SST and the ground selection transistor GST may consist of a transistor that is the same as that of the memory cell or consist of a transistor that is different from that of the memory cell. Depending on the kind of transistor constituting the string selection transistor SST or the ground selection transistor GST, the string selection transistor SST or the ground selection transistor GST may serve as a dummy memory cell.

Referring to FIG. 1 again, a row selection circuit (or an X-selector) 200 performs an operation for selecting one memory block from memory blocks in the memory cell array 100 and an operation for selecting one word line from word lines in the selected memory block in response to a control of a control logic 700.

A voltage generator 300 generates word line voltages (e.g., a program voltage, a read voltage, a pass voltage, etc.) to be supplied to word lines according to an operation mode in response to a control of the control logic 700. The voltage generator 300 is configured to generate a bulk voltage to be supplied to a bulk region (e.g., a well region) having memory cells in response to a control of the control logic 700. The row selection circuit 200 (or the X-selector in FIG. 1) drives a selected word line and unselected word lines with word line voltages supplied from the voltage generator 300 in response to a control of the control logic 700.

A page buffer 400 is controlled by the control logic 700 and may operate as a sense amplifier or a write driver. For example, in the case of a verify/normal read operation, the page buffer 400 operates as a sense amplifier for reading data from the memory cell array 100. In the case of a program operation, the page buffer 400 operates as a write driver for driving bit lines according to data to be stored in the memory cell array 100. The page buffer 400 may consist of page buffers (not shown) corresponding to columns (or bit lines), respectively, or page buffers corresponding to pairs of columns (or pairs of bit lines), respectively. Connections between page buffers and bit lines are not limited to the aforementioned and thus may be made in other ways.

A column selection circuit 500 (or a Y-selector in FIG. 1) may be configured to provide a data transmission path between e.g., a memory controller outside of a flash memory chip and the page buffer 400 in response to a control of the control logic 700. Additionally, the column selection circuit 500 is configured to provide a data transmission path between a pass/fail check circuit 600 (or a P/F check in FIG. 1) and the page buffer 400 in response to a control of the control logic 700. Functions of the memory controller are performed in the column selection circuit 500 during a normal read/program operation. In addition, functions of the pass/fail check circuit 600 are performed in the column selection circuit 500 during a pass/fail verify operation of a program/erase operation.

The pass/fail check circuit 600 may be configured to determine whether all data bits delivered from the column selection circuit 500 during a pass/fail verify operation of a program/erase operation have pass data or not. For example, if it is determined that all the data bits delivered from the column selection circuit 500 are pass data, the pass/fail check circuit 600 outputs pass information to the control logic 700. If it is determined that at least one of the data bits delivered from the column selection circuit 500 is fail data, the pass/fail check circuit 600 outputs fail information to the control logic 700.

A program operation performed in the flash memory device 1000 may consist of a plurality of program loops. An erase operation performed in the flash memory device 1000 may consist of a plurality of erase loops. In addition, each of the program/erase loops may include a program/erase execution interval, a delay time interval, and a verify interval.

The control logic 700 may be configured to control operations such as program, erase, and read operations of the flash memory device 1000 according to an exemplary embodiment of the inventive concept. The control logic 700 may control whether to repeat program/erase loops and a level and applying time of a voltage for each program/erase loop based on the pass/fail information provided from the pass/fail check circuit 600.

In an exemplary embodiment of the inventive concept, the control logic 700 may selectively change an erase operation condition (e.g., a length of delay time, a counter pulse, and a level of a word line voltage) in response to a temperature detection result Temp. The temperature detection result Temp may be obtained through a means for measuring a change of current or resistance which change in accordance with a change in temperature. Types of temperature detecting sensors and places where they are arranged may vary. For example, the temperature detecting sensor may be equipped at the external (e.g., at a host or a controller) or the inside of a flash memory chip.

In an erase method according to an exemplary embodiment of the inventive concept, by using a temperature detection result Temp, even when electrons/holes are stabilized slowly in an operating environment of a cold temperature, an erase verify operation may be performed in consideration of the slow stabilizing speed; or a transfer speed of the electrons/holes may be accelerated to speed up the stabilization process. As a result, an error occurrence rate may be reduced during an erase verify operation and a high erase accuracy and stable performance may be secured. Additionally, a change of an erase operation condition may be performed only when the temperature detection result Temp is lower than a predetermined voltage, so that the flash memory device 1000 may operate at an optimized speed.

Figure 3:
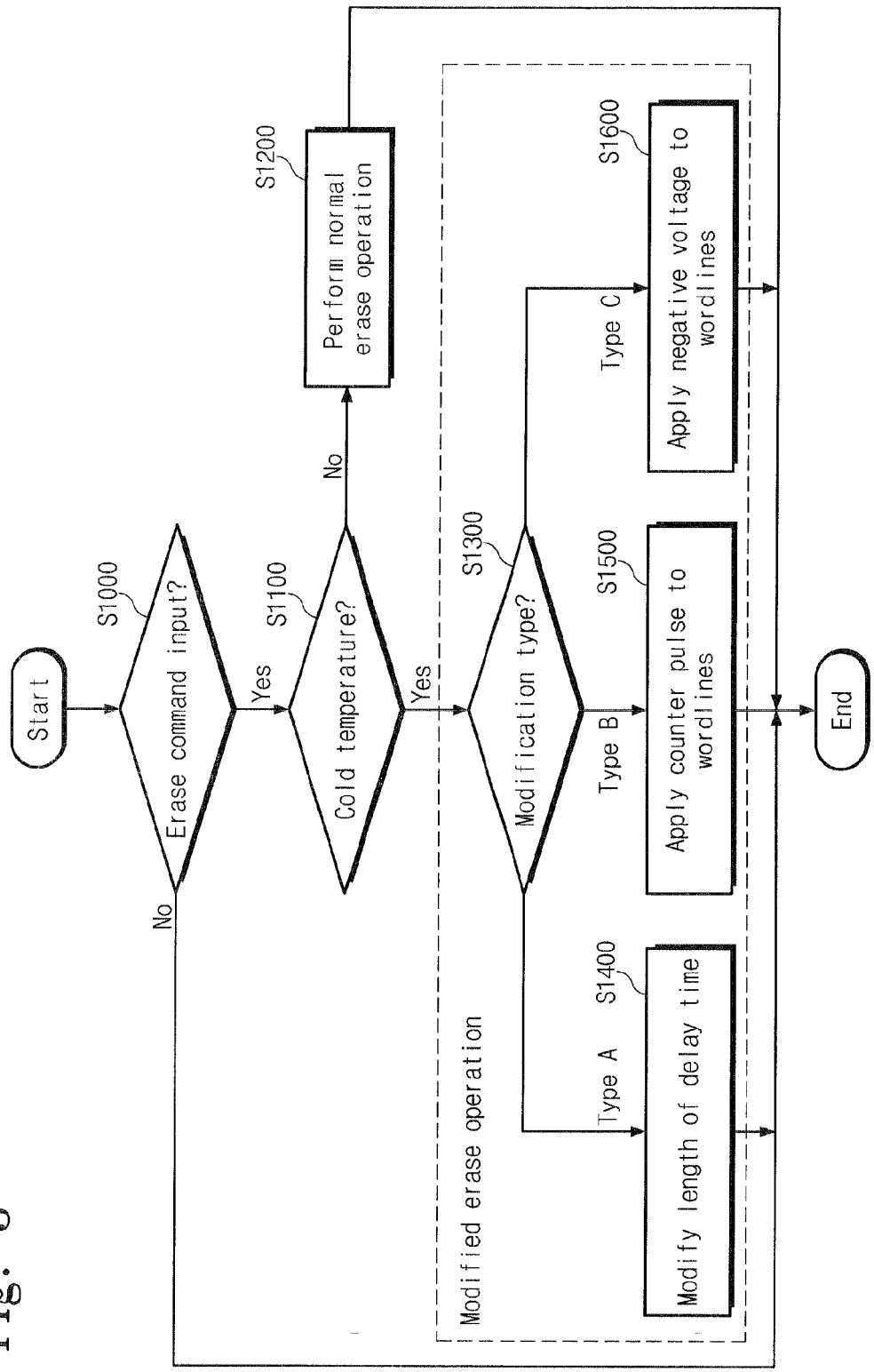
FIG. 3 is a flowchart illustrating an erasing method according to an exemplary embodiment of the inventive concept.

FIG. 3 is a flowchart illustrating an erasing method according to an exemplary embodiment of the inventive concept.

Referring to FIG. 3, a flash memory according to an exemplary embodiment of the inventive concept determines whether an erase command is inputted or not to perform an erase operation in operation S1000. The erase command may be provided from the external (e.g., a host or a memory controller) of a flash memory chip to the control logic 700.

Based on the determination result of operation S1000, if the erase command is inputted, the control logic 700 determines whether a temperature detection result Temp indicates a cold temperature or not in operation S1100 (e.g., whether the temperature detection result Temp is lower than a predetermined reference voltage). In an exemplary embodiment of the inventive concept, the temperature detection result Temp may correspond to a predetermined temperature range (e.g., a cold temperature range, a room temperature range, or a hot temperature range). Additionally, each temperature range may be subdivided into at least one sub range. In this case, the temperature detection result Temp may correspond to each sub range. In an exemplary embodiment of the inventive concept, the temperature detection result Temp and a temperature range corresponding thereto may vary.

Based on the determination result of operation S1100, if the temperature detection result Temp does not correspond to a cold temperature range, the flash memory may perform a normal erase operation in response to a control of the control logic 700 in operation S1200. In an exemplary embodiment of the inventive concept, the normal erase operation may consist of a plurality of erase loops and each erase loop may consist of an erase execution interval, a delay time interval, and a verify interval. During the normal erase operation, erase operation conditions (e.g., the length of delay time, a counter pulse, and a level of a word line voltage applied during an erase operation, etc.) are not changed and an erase condition set when the flash memory is released from a factory may be maintained as is. An erase operation condition applied to a normal erase operation may be set based on the condition that the flash memory operates at a room temperature.

Moreover, based on the determination result of operation S1100, if the temperature detection result Temp corresponds to a cold temperature range, the flash memory changes an erase operation condition in response to a control of the control logic 700 to perform a modified erase operation in operations S1300 to S1600. Like the normal erase operation, the modified erase operation may consist of a plurality of erase loops and each loop may consist of an erase execution interval, a delay time interval, and a verify interval. The modified erase operation may mean that an erase operation condition (e.g., the length of delay time, a counter pulse, and a level of a word line voltage applied during an erase operation, etc.) applied during at least one of the erase execution interval, the delay time interval, and the verify interval is modified from the factory setting. As shown in FIG. 3, the modified erase operation according to an exemplary embodiment of the inventive concept may be classified into three types (type A, type B, and type C) according to an erase operation. However, the erase operation may be modified in various ways.

In operation S1300, to perform an erase operation according to an exemplary embodiment of the inventive concept in an operating environment of a cold temperature, firstly, a modification type to be applied to an erase operation may be determined in operation S1300.

If a modified erase operation of the type A is determined in operation S1300, the control logic 700 performs an erase operation by modifying the length of a delay time interval, e.g., the length of a delay time, in operation S1400. In an exemplary embodiment of the inventive concept, in the modified erase operation of the type A, an erase operation is performed by setting the length of the delay time to be longer than that of a normal erase operation. The length of the delay time applied to the modified erase operation of the type A may be set greater than 0.1 ms. Additionally, the length of the delay time applied to the modified erase operation of the type A is not fixed with a specific value and thus, may vary according to a temperature range corresponding thereto. In an exemplary embodiment of the inventive concept, as a temperature in which the flash memory device operates becomes lower than say the aforementioned cold temperature, the length of the delay time applied to the modified erase operation of the type A extends. The length of the delay time changed according to the temperature detection result Temp may be stored in a predetermined data form, e.g., a table form, to increase efficiency of a control operation of the control logic 700. A method of determining the length of the delay time changed according to the temperature detection result Temp is not limited to a specific technique and thus, various techniques may be contemplated. According to this modification of the length of the delay time performed in operation S1400, an erase verify operation is performed after a threshold voltage Vth of a memory cell is sufficiently stabilized, therefore erase error occurrence may be reduced in a cold temperature operating environment.

If a modified erase operation of the type B is determined in operation S1300, the control logic 700 may apply a counter pulse having a predetermined voltage level to a word line during a delay time interval of an erase loop in operation S1500. Although it will be described below in more detail, once an erase voltage is applied to a CTF memory, electrons/holes may transit in an energetically-stabilized direction during a delay time interval. At this point, if a counter pulse is applied to a word line to have an electric field in an opposite direction to that formed by an erase voltage, the electron/hole transfer may be accelerated in a direction so that a threshold voltage Vth of a memory cell is stabilized. As a result, since an erase verify operation is performed after a threshold voltage Vth of a memory cell is sufficiently stabilized, erase error occurrence may be reduced in a cold temperature operating environment.

In addition, if a modified erase operation of the type C is determined in operation S1300, the control logic 700 may apply a predetermined negative voltage to a word line during an erase interval of an erase loop in operation S1600. During the erase interval, an erase voltage is applied to a bulk region of a flash memory. The negative voltage applied to the word line in operation S1600 may be applied in parallel to an erase voltage applied to the bulk region. Here, the length of an interval to which a negative voltage is applied and the size of a voltage applied may vary. For example, if a temperature in which the flash memory device operates becomes a lower cold temperature, the length of an interval that a negative voltage is applied may be increased during the modified erase operation of the type C. Moreover, as the temperature in which the flash memory device operates becomes a lower cold temperature, a level of a negative voltage applied may be increased during the modified erase operation of the type C.

In this case, without increasing a level of an erase voltage, the size of an electric field applied to a bulk region may be increased during an erase interval. The increased size of an electric field may accelerate a speed that a threshold voltage Vth of a memory cell is stabilized during a delay time interval. Accordingly, erase error occurrence may be reduced in a cold temperature operating environment.

In the above-mentioned erase method according to an exemplary embodiment of the inventive concept, according to the temperature detection result Temp, the method may switch to one of the type A, the type B, and the type C processes. The erase method according to an exemplary embodiment of the inventive concept may be modified in varies ways. For example, according to another exemplary embodiment of the inventive concept, the erase method may switch to a combination of at least two of the type A, the type B, and the type C processes based on the temperature detection result Temp.

Figure 4:
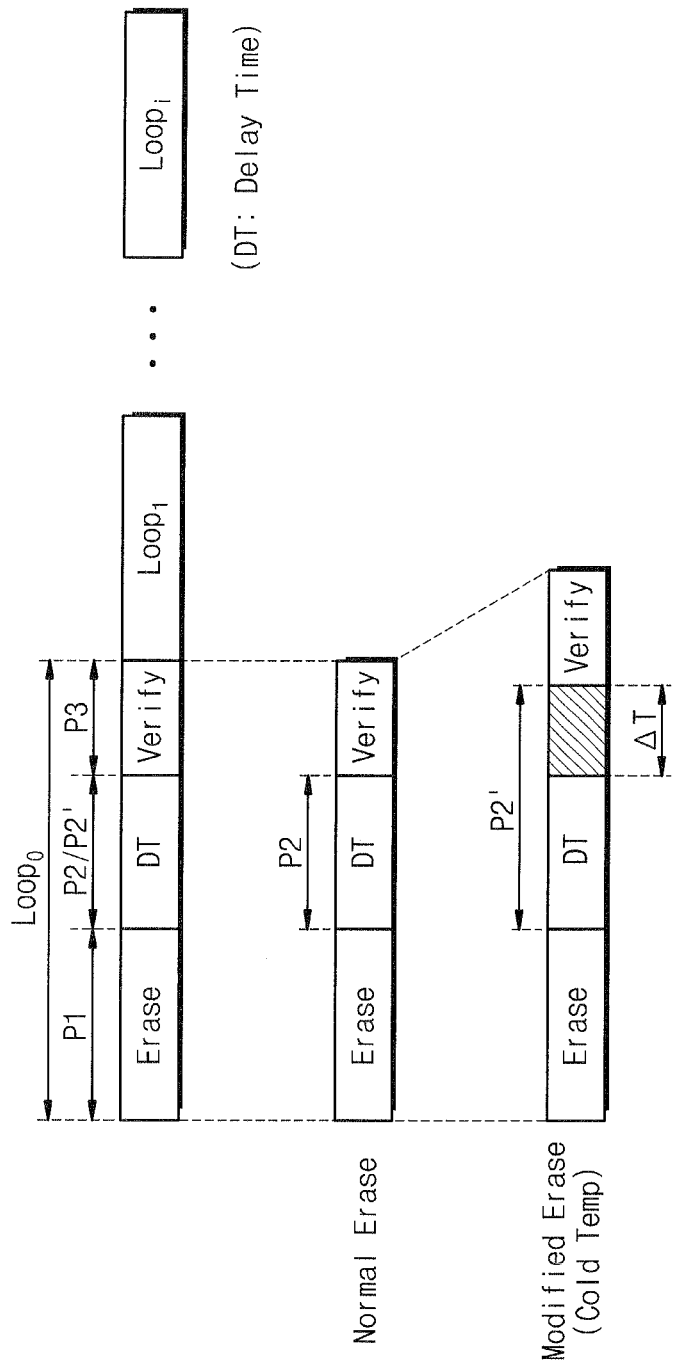
FIG. 4 is a view illustrating an erase operation according to an exemplary embodiment of the inventive concept.
Figure 5:
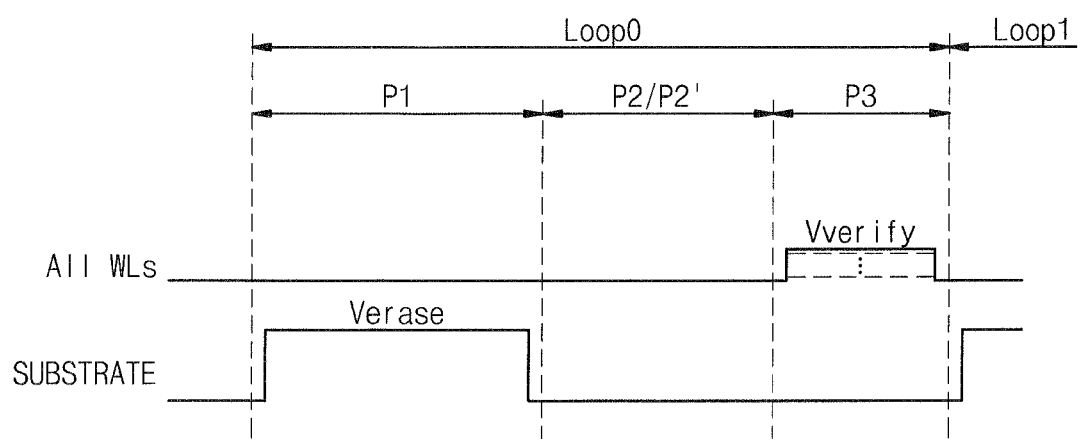
FIG. 5 is a view illustrating a bias condition applied during the erase operation of FIG. 4.

FIG. 4 is a view illustrating an erase operation according to an exemplary embodiment of the inventive concept. FIG. 5 is a view illustrating a bias condition applied during the erase operation of FIG. 4. Hereinafter, the modified erase operation of the type A shown in FIG. 3 will be described in more detail with particular reference to FIGS. 4 and 5.

Referring to FIG. 4, an erase operation of a flash memory device according to an exemplary embodiment of the inventive concept may consist of a plurality of erase loops $LOOP_0$ to $LOOP_i$. Each of the erase loops $LOOP_0$ to $LOOP_i$ may consist of an erase execution interval P1, a delay time interval P2/P2', and a verify interval P3. During the erase execution interval P1, the control logic 700 controls the row selection circuit 200 and the voltage generator 300 so that a word line voltage (e.g., a voltage greater than or equal to about 0V and less than a power voltage Vdd) is applied to word lines of a selected memory block and an erase voltage Verase (e.g., 20V) is applied to a bulk region having memory cells. Under this bias condition, memory cells of a selected memory cell are erased.

Electrons/holes in a charge storage layer of a flash memory are energetically-stabilized during the delay time interval P2/P2', and a threshold voltage Vth of a memory cell is stabilized to an erase level. According to an exemplary embodiment of the inventive concept, the flash memory may be in a discharge bias condition (e.g., a state that a voltage of 0V is applied to a word line and a bulk region) during the delay time interval P2/P2'. In the erase method according to an exemplary embodiment of the inventive concept, especially in the case of the modified erase operation of the type A, a delay time interval (hereinafter, referred to as a first delay time interval) indicated with P2 and a delay time interval (hereinafter, referred to as a second delay time interval) indicated with P2' may be selectively applied according to the temperature detection result Temp.

The first delay time interval P2 shown in FIG. 4 may mean a delay time interval applied in a normal erase operation. In an exemplary embodiment of the inventive concept, the length of the first delay time interval P2 is defined within a range of greater than or equal to 1 μs and less than 0.1 ms. A normal erase operation may be performed in response to a control of the control logic 700 when the temperature detection result Temp corresponds to a range of a room temperature or a hot temperature.

The second delay time interval P2' shown in FIG. 4 may mean a delay time interval applied in a modified erase operation (e.g., the modified erase operation of the type A shown in FIG. 3). The first delay time interval P2 and the second delay time interval P2' have a difference by a predetermined time ΔT. The second delay time interval P2' corresponds to additionally further delaying the first delay time interval P2 by the predetermined time ΔT.

In an exemplary embodiment of the inventive concept, the length of the second delay time interval P2' may be defined with a value of greater than 0.1 ms. The modified erase operation may be performed in response to a control of the control logic 700 when the temperature detection result Temp corresponds to a cold temperature range. The length of the second delay time interval P2' is not fixed with a specific value and may vary according to the temperature detection result Temp and a temperature range corresponding thereto. For example, as a temperature in which the flash memory device operates becomes a lower cold temperature, the length of the second delay time interval P2' may be extended. The length of the second delay time interval P2' changed according to the temperature detection result Temp may be determined according to delay time interval setting information stored in a predetermined data form, e.g., a table form, or may be determined in response to a control signal provided from the control logic 700 or the external (e.g., a controller or a host) of the flash memory. A method of determining the length of the second delay time interval P2' according to the temperature detection result Temp is not limited to these techniques and thus, various approaches are contemplated.

Next, during the verify interval P3, the row selection circuit 200 and the voltage generator 300 apply a predetermined verify voltage to word lines of a selected memory block in response to a control of the control logic 700. As shown in FIG. 5, a verify voltage verify supplied to word lines during the verify interval P3 may be differently set depending on when 1-bit data is stored in a memory cell or N-bit data (N is equal to or greater than 2) is stored in a memory cell.

The page buffer 400 senses a voltage shift of corresponding bit lines in response to a control of the control logic 700. According to a voltage sense result of the page buffer 400, some bits (e.g., x8, x16, x32, etc.) of data read from the page buffer 400, may be delivered to the pass/fail check circuit 600 through the column selection circuit 500 according to the control logic 700. This is referred to as a column scan operation. The pass/fail check circuit 600 verifies whether data bits delivered to the pass/fail check circuit 600 are all pass data or not.

If it is determined that data bits delivered to the pass/fail check circuit 600 are all pass data, the control logic 700 controls some remaining data read through the buffer circuit 400 to be delivered to the pass/fail check circuit 600 through the column selection circuit 500. On the contrary, if it is determined that at least one of the data bits inputted to the pass/fail check circuit 600 is fail data, the control logic 700 stops the column scan operation and performs the next erase loop.

The next erase loop is performed through the same method as the above-mentioned erase through execution of interval P1, delay time interval P2/P2', and verify interval P3. Accordingly, its detailed description will be omitted. An erase loop may be repeated a predetermined number of times. The number of executions of an erase loop may be increased as the number of fails detected during an erase verify operation increase.

If the delay time interval P2/P2' is not changed according to a change of temperature, the verify interval P3 is executed before electrons/holes are sufficiently stabilized in an operating environment of a cold temperature. Data read from a memory cell when electrons/holes are not sufficiently stabilized during an erase operation may be determined as fail data. This may lead to an increase in the number of executions of an erase loop and an increase in a high voltage stress (e.g., an erase voltage of 20V) applied to a memory cell.

However, the erase method according to an exemplary embodiment of the inventive concept may change the delay time interval P2/P2' according to a change of temperature. As a result, even if electrons/holes are slowly stabilized in an operating environment of a cold temperature, the first delay time interval P2 may be changed to the second delay time interval P2' by increasing the first delay time interval P2 by $\Delta T$ in consideration of a slower stabilizing speed at this temperature. As a result, an error occurrence rate may be reduced during an erase verify operation, and high erase accuracy and stable performance may be secured. Additionally, a change of an erase operation condition according to an exemplary embodiment of the inventive concept (e.g., a change of the delay time interval P2/P2') may be selectively performed only when the temperature detection result Temp is less than a predetermined voltage, so that the flash memory device operates at an optimized speed.

Figure 6:
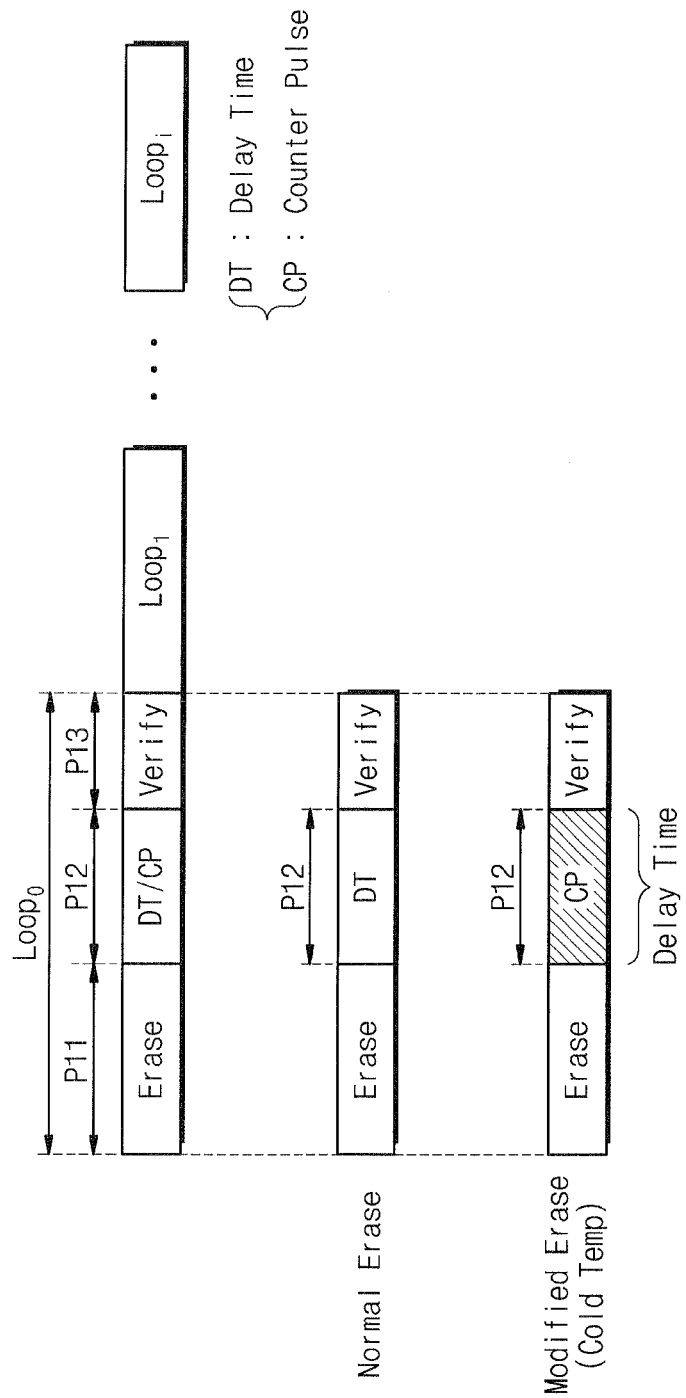
FIG. 6 is a view illustrating an erase operation according to an exemplary embodiment of the inventive concept.
Figure 7:
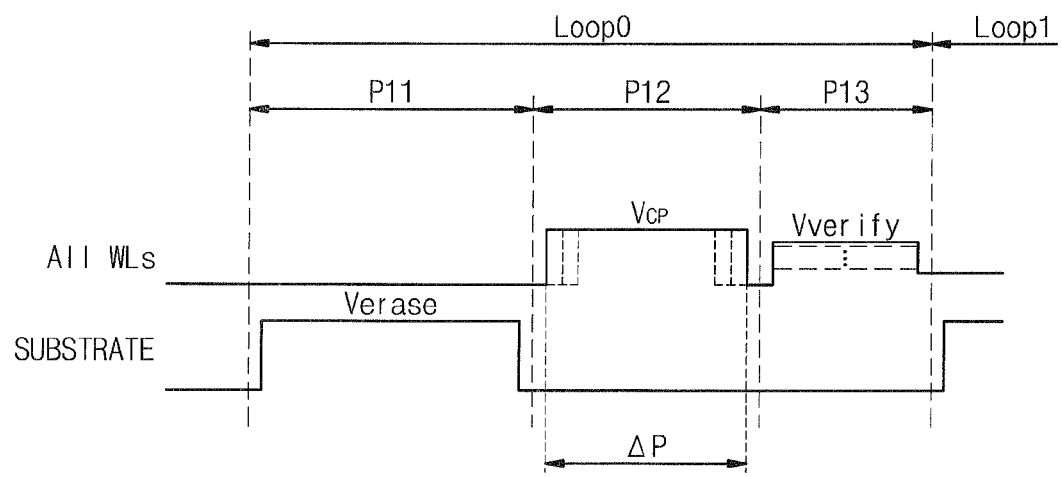
FIGS. 7 and 8 are views illustrating a bias condition applied during the erase operation of FIG. 6.
Figure 8:
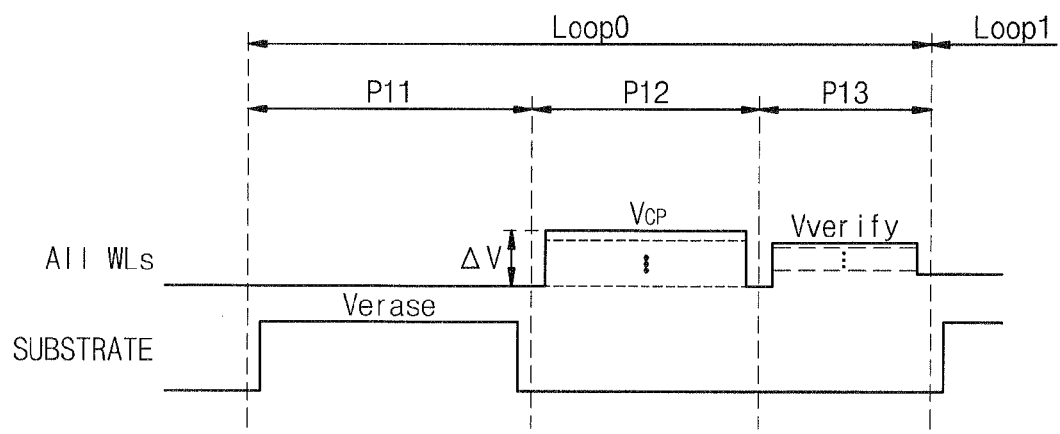

FIG. 6 is a view illustrating an erase operation according to an exemplary embodiment of the inventive concept. FIGS. 7 and 8 are views illustrating a bias condition applied during the erase operation of FIG. 6. Hereinafter, the modified erase operation of the type B shown in FIG. 3 will be described in more detail with particular reference to FIGS. 6-8.

Referring to FIG. 6, an erase operation of a flash memory device according to an exemplary embodiment of the inventive concept may consist of a plurality of erase loops $\text{LOOP}_0$ to $\text{LOOP}_i$. Each of the erase loops $\text{LOOP}_0$ to $\text{LOOP}_i$ may consist of an erase execution interval P11, a delay time interval P12, and a verify interval P13. The erase execution interval P11 of FIG. 6 may be identical to P1 of FIG. 4. The erase verify interval P13 of FIG. 6 may be identical to P3 of FIG. 4. Accordingly, to avoid overlapping description, a detailed description about the erase execution interval P11 and the erase verify interval P13 will be omitted.

Electrons/holes in a charge storage layer of a flash memory erased during the erase execution interval P11 are energetically-stabilized during the delay time interval P12 and also, a threshold voltage Vth of a memory cell is stabilized to an erase level. The erase method according to an exemplary embodiment of the inventive concept may apply a counter pulse CP to word lines of a memory block to be erased during the delay time interval P12 in the case of the modified erase operation of the type B performed when the flash memory is in an operating environment of a cold temperature.

In FIG. 6, DT indicated in the delay time interval P12 may mean a delay time interval applied in a normal erase operation in which the counter pulse CP is not applied. In the case of the normal erase operation, the flash memory may be in a discharge bias condition (e.g., a state that a voltage of 0V is applied to a word line and a bulk region) during the delay time interval P12. A normal erase operation may be performed in response to a control of the control logic 700 when the temperature detection result Temp corresponds to a room temperature or a hot temperature.

Moreover, CP indicated in the delay time interval P12 of FIG. 6 may mean a delay time interval applied in a modified erase operation (e.g., the modified erase operation of the type B of FIG. 3). In the case of the modified erase operation of the type B, a counter pulse Vcp having a predetermined voltage level may be applied to word lines of an erased memory block during the delay time interval P12. The counter pulse Vcp applied during the delay time interval P12 accelerates the transfer of the energy of electrons/holes in a charge storage layer of a flash memory toward a stabilized direction. As a result, when an operating temperature of the flash memory is lowered, a stabilizing speed of a threshold voltage Vth of a memory cell may be sped up, so that erase error occurrence may be reduced in a cold temperature operating environment. An exemplary form of the counter pulse Vcp applied during the delay time interval P12 is shown in FIGS. 7 and 8.

The width $\Delta P$ of the counter pulse Vcp applied during the delay time interval P12 may be set diversely as shown in FIG. 7. The width $\Delta P$ of the counter pulse Vcp may be set to be different according to the temperature detection result Temp. For example, as the sensed temperature is lowered, the width $\Delta P$ of the counter pulse Vcp may be broadened.

Additionally, a voltage level $\Delta V$ of the counter pulse Vcp applied during the delay time interval P12 may be set diversely as shown in FIG. 8. The voltage level $\Delta V$ of the counter pulse Vcp may be set to be different according to the temperature detection result Temp. For example, as the detected temperature becomes lower, the voltage level $\Delta V$ of the counter pulse Vcp may be increased. The voltage level $\Delta V$ of the counter pulse Vcp may be diversely set or set within a range of higher than 0V and lower than a program voltage Vpgm.

Moreover, although not shown in FIGS. 7 and 8, in the erase method according to an exemplary embodiment of the inventive concept, the number of applications of the counter pulse Vcp during the delay time interval P12 may be set to be greater than or equal to 1. In an exemplary embodiment of the present inventive concept, the number of applications of the counter pulse Vcp may be set to be different according to the temperature detection result Temp. For example, as the sensed temperature becomes lower, the number of applications of the counter pulse Vcp may be increased. The width, voltage level, and number of applications of the above-mentioned counter pulse Vcp are not limited to a specific value and thus, their values may vary.

Figure 9:
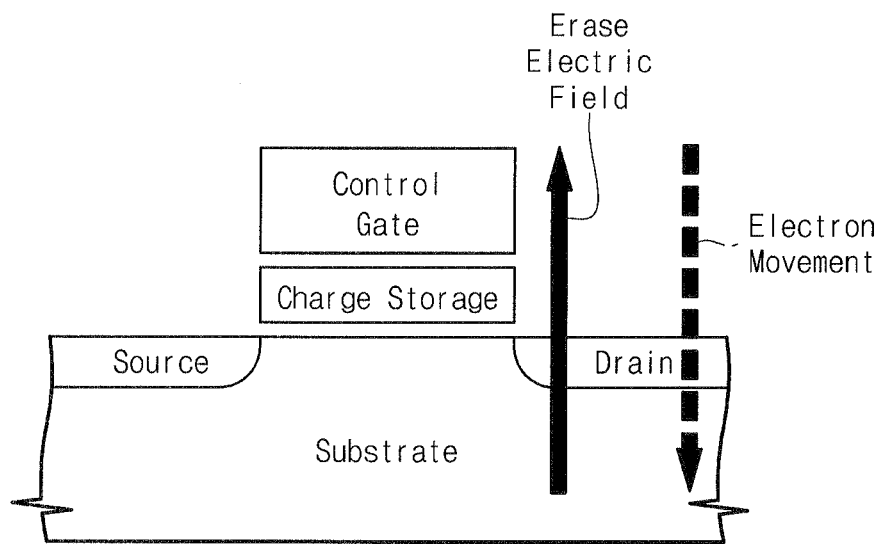
FIGS. 9 and 10 are views illustrating an electric field applied to a memory cell in the erase operation shown in FIGS. 7 and 8.
Figure 10:
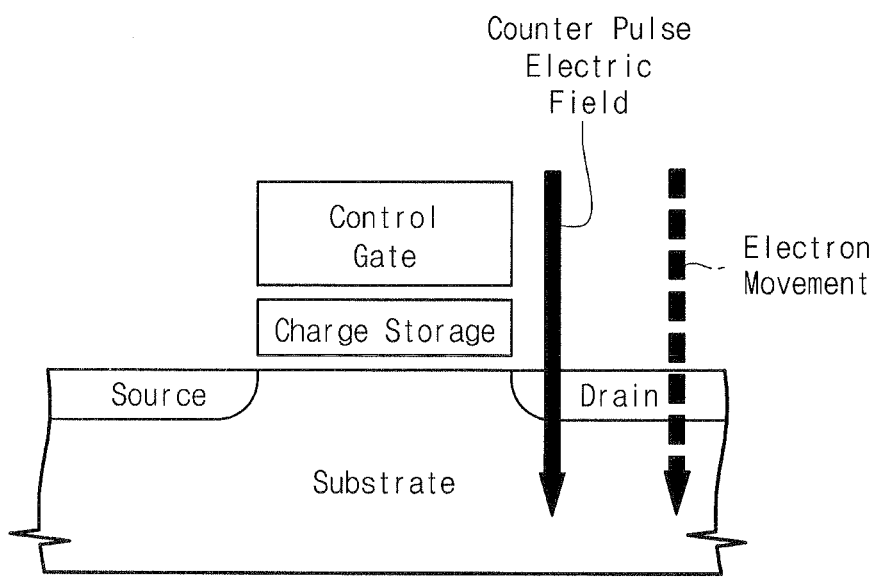

FIGS. 9 and 10 are views illustrating an electric field applied to a memory cell in the erase operation shown in FIGS. 7 and 8.

Referring to FIG. 9, once an erase voltage Verase is applied in the erase execution interval P11 according to the bias condition shown in FIGS. 7 and 8, an electric field (refer to the solid line) occurs in a direction from a bulk region (e.g., a substrate) to a control gate of a flash memory. Then, electrons/holes in a charge storage layer transfer to an energetically-stabilized direction during the delay time interval P12. More specifically, during the delay time interval P12, the electrons/holes in the charge storage layer may transfer in an opposite direction to the electric field (refer to the dotted line) formed in the erase execution interval P11.

However, as shown in FIG. 10, a counter pulse Vcp may be applied during the delay time interval P12 (refer to the solid line). In an exemplary embodiment of the inventive concept, an electric field formed in the flash memory by the counter pulse Vcp applied during the delay time interval P12 may have an opposite direction to that formed in the erase execution interval P11. Accordingly, the electric field formed in the flash memory by the counter pulse Vcp may be formed in the same direction as the transfer direction (refer to the dotted line) of the electrons/holes. Accordingly, in the erase method according to an exemplary embodiment of the inventive concept, electron/hole transfer in the charge storage layer is accelerated by the counter pulse Vcp applied during the delay time interval P12, and thereby, rearrangement/recombination of the electrons/holes in the charge storage layer is accelerated. Accordingly, erase error occurrence may be reduced in a cold temperature operating environment.

Figure 11:
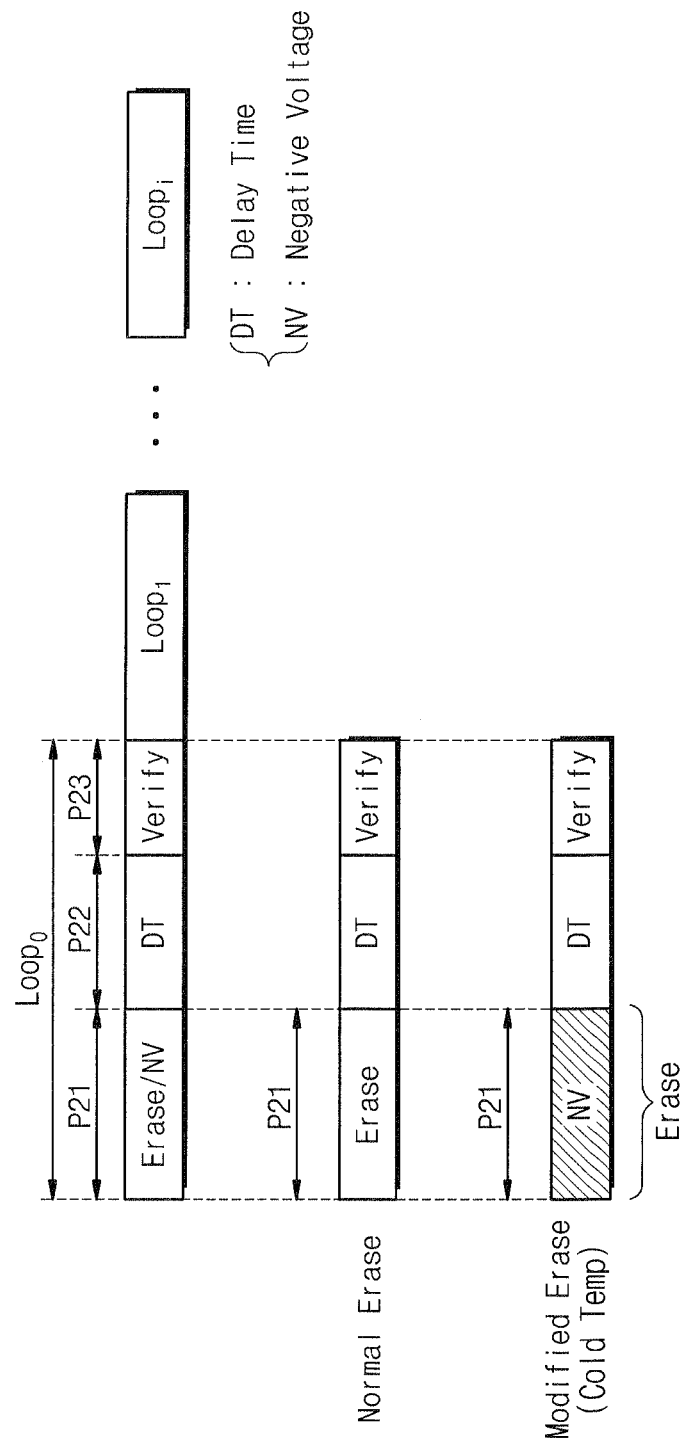
FIG. 11 is a view illustrating an erase operation according to an exemplary embodiment of the inventive concept.
Figure 12:
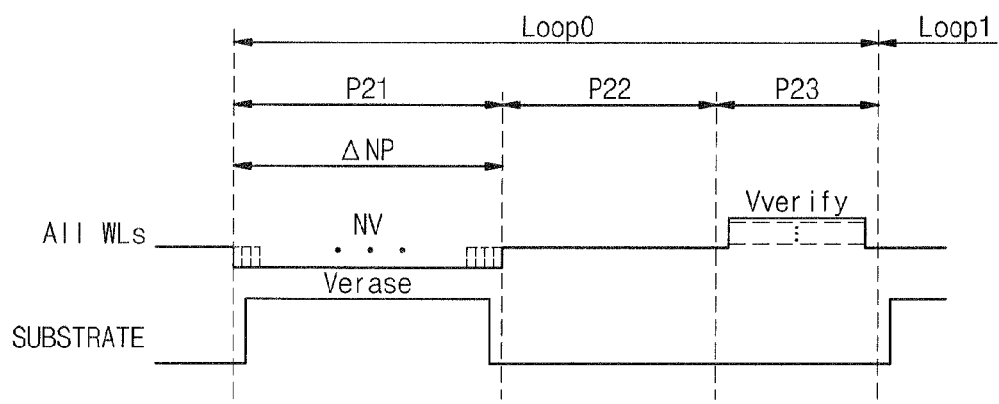
FIGS. 12 and 13 are views illustrating a bias condition applied during the erase operation of FIG. 11.
Figure 13:
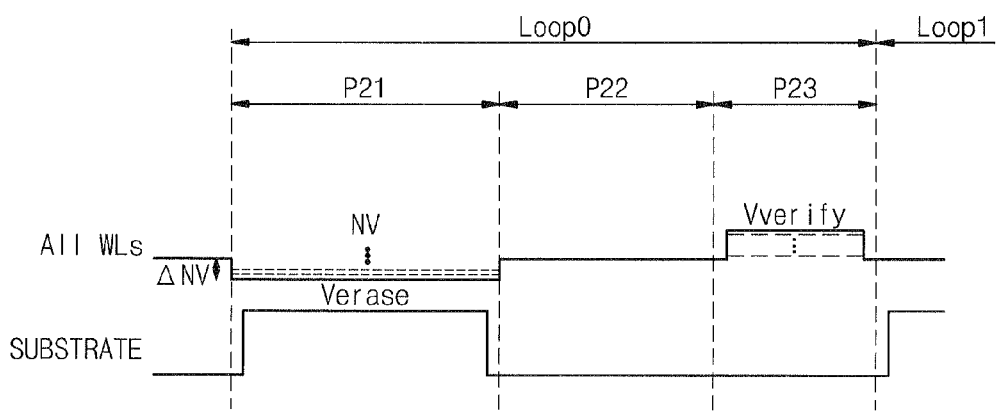

FIG. 11 is a view illustrating an erase operation according to an exemplary embodiment of the inventive concept. FIGS. 12 and 13 are views illustrating a bias condition applied during the erase operation of FIG. 11. Hereinafter, the modified erase operation of the type C shown in FIG. 3 will be described in more detail with particular reference to FIGS. 11-13.

Referring to FIG. 11, an erase method of a flash memory device according to an exemplary embodiment of the inventive concept may consist of a plurality of erase loops LOOP$_0$ to LOOP$_i$. Each of the erase loops LOOP$_0$ to LOOP$_i$ may consist of an erase execution interval P21, a delay time interval P22, and an erase verify interval P23. The delay time interval P22 of FIG. 11 may be identical to P2 of FIG. 4. The verify interval P23 of FIG. 11 may be identical to P3 of FIG. 4. Accordingly, to avoid overlapping description, a detailed description about the delay time interval P22 and the erase verify interval P23 will be omitted.

During the erase execution interval P21, the control logic 700 controls the row selection circuit 200 and the voltage generator 300 to apply a negative voltage NV lower than 0V to word lines of a selected memory block and apply an erase voltage (e.g., 20V) to a bulk region having memory cells. Memory cells of a memory block selected under this bias condition are erased.

As shown in FIG. 12, the length ΔNP of an interval in which a negative voltage is applied to a word line during the erase execution interval P21 is not limited to a specific value and thus may vary. For example, as a temperature that a flash memory device operates becomes a lower cold temperature, the length ΔNP of an interval in which a negative voltage is applied during the modified erase operation of the type C may be increased.

Additionally, as shown in FIG. 13, the level ΔNV of a negative voltage applied to a word line during the erase execution interval P21 is not limited to a specific value and may vary. For example, as a temperature that a flash memory device operates becomes a lower cold temperature, the level ΔNV of a negative voltage applied during the modified erase operation of the type C may be increased.

According to this use of the negative voltage, without increasing a level of an erase voltage, the size of an electric field applied to a bulk region may be increased during an erase interval. The increased size of the electric field may accelerate a speed that a threshold voltage Vth of a memory cell is stabilized during the delay time interval P22. Accordingly, erase error occurrence may be reduced in a cold temperature operating environment.

In the above-mentioned erase method according to an exemplary embodiment of the inventive concept, according to the temperature detection result Temp, one of the type A, the type B, and the type C processes may be employed. In another exemplary embodiment of the inventive concept, the erase method may employ a combination of at least two of the type A, the type B, and the type C processes based on the temperature detection result Temp. Accordingly, the erase method according to an exemplary embodiment of the inventive concept may be modified and altered in various forms.

In an exemplary embodiment of the inventive concept, the flash memory may consist of a CTF memory using an insulation layer of $Si_3N_4$, $Al_2O_3$, HfAlO, or HfSiO as a charge storage layer. Additionally, the flash memory device according to an exemplary embodiment of the inventive concept may consist of a stacked flash structure (where arrays are stacked in a multilayer fashion), a flash structure without sources and drains, a pin-type flash structure, or a three-dimensional flash structure.

Figure 14:
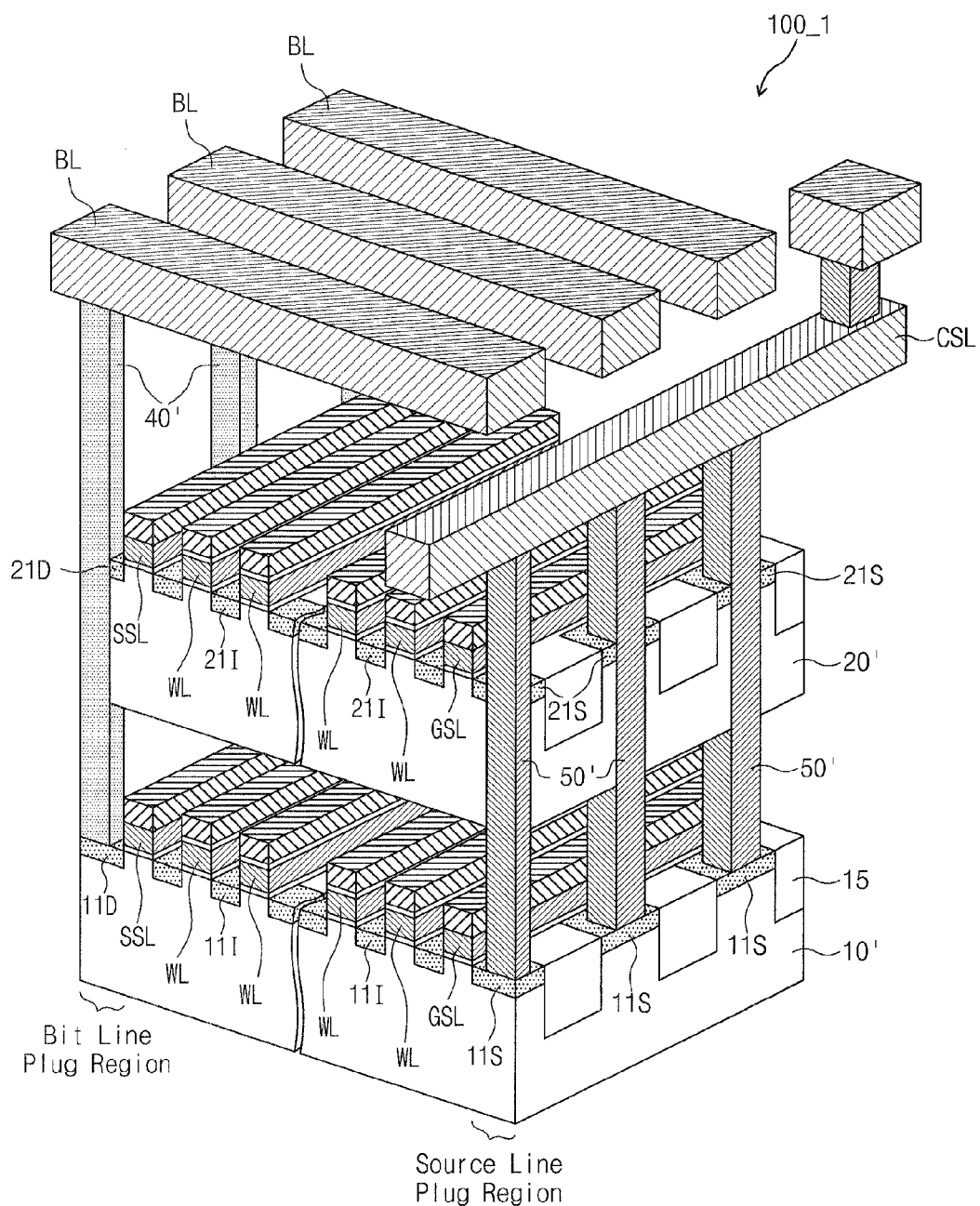
FIG. 14 is a view illustrating a structure of a memory cell array according to an exemplary embodiment of the inventive concept.

FIG. 14 is a view illustrating a structure of a memory cell array according to an exemplary embodiment of the inventive concept. In FIG. 14, a cell array 100_1 of a stacked flash structure is exemplarily shown.

Referring to FIG. 14, the flash memory device may include three-dimensionally arranged memory cells. The memory cells may be formed of a plurality of stacked semiconductor layers used as a semiconductor substrate for forming a Metal-Oxide-Silicon transistor. In FIG. 14, two semiconductor layers (e.g., a first semiconductor layer 10' and a second semiconductor layer 20') are shown for convenience of description but the number of semiconductor layers may be more than two.

In an exemplary embodiment of the inventive concept, the first semiconductor layer 10' may be a single crystal silicon wafer and the second semiconductor layer 20' may be a single crystal silicon epitaxial layer formed through an epitaxial process using the first semiconductor layer 10' (e.g., a wafer) as a seed layer. According to an exemplary embodiment of the inventive concept, each of the semiconductor layers 10' and 20' may include a cell array having substantially the same structure and the memory cells of the cell arrays may constitute the cell array 100_1 of a plurality of layers.

Each of the semiconductor layers 10' and 20' may include active regions defined by device isolation layer patterns 15. The active regions may be formed laterally along one direction. The device isolation layer patterns 15 may be formed of an insulation material including a silicon oxide layer and may electrically insulate the active regions.

A gate structure consisting of one pair of selection lines GSL and SSL and M word lines WL crossing over the active regions may be disposed on each of the semiconductor layers 10' and 20'. Source plugs 50' are disposed at one side of the gate structure and bit line plugs 40' may be disposed at the other side of the gate structure. The bit line plugs 40' may respectively contact N bit lines BL crossing over the word lines WL. For example, the bit lines BL may be formed to cross over the word lines WL on the uppermost semiconductor layer (e.g., the second semiconductor layer 20' of FIG. 14). The number N of the bit lines BL may be an integer greater than one and may be an integer of multiples of eight.

The word lines WL are disposed between the selection lines GSL and SSL and the M number of word lines WL constituting one gate structure is an integer greater than one. The integer M may be a multiple of eight. One of the selection lines GSL and SSL may be used as a ground selection line GSL for controlling an electrical connection between a common source line CSL and memory cells. Moreover, the other selection line may be used as a string selection line SSL for controlling an electrical connection between the bit lines BL and memory cells.

Impurity regions may be formed in an active region between the selection lines GSL and SSL and word lines WL. For example, impurity regions 11S and 21S formed at one side of the ground selection line GSL may be used as source electrodes connected through the common source line CSL and impurity regions 11D and 21D formed at one side of the string selection line SSL may be used as drain electrodes connected to the bit lines BL through the bit line plugs 40'. Additionally, impurity regions 11I and 21I formed at both sides of the word lines WL may be used as internal impurity regions connecting the memory cells in series.

According to an exemplary embodiment of the inventive concept, the source plugs 50' are formed in the first and second semiconductor layers 10' and 20' thereby electrically connecting the impurity regions 11S and 21S (hereinafter, referred to as first and second source regions), which are used as a source electrode, with the semiconductor layers 10' and 20'. As a result, the first and second source regions 11S and 21S and the semiconductor layers 10' and 20' are equipotential. For this electrical connection, according to an exemplary embodiment of the inventive concept, the source plugs 50' may penetrate the second semiconductor layer 20' and the second source region 21S to connect to the first source region 11S. In this case, the source plug 50' may directly contact the inner walls of the second semiconductor layer 20' and the second source region 21S.

The above-mentioned erase method according to an exemplary embodiment of the inventive concept may be applied to the flash memory having the stacked flash structure of FIG. 14. Besides that, the erase method according to an exemplary embodiment of the inventive concept may be applied to a three-dimensional flash memory cell structure having three-dimensionally formed memory cells. A method of fabricating the three-dimensional flash memory device is not based on repeatedly stacking two-dimensional memory cells but rather is based on forming word lines or word line plates through a patterning process for defining an active region so that manufacturing cost per bit may be reduced.

Figure 15:
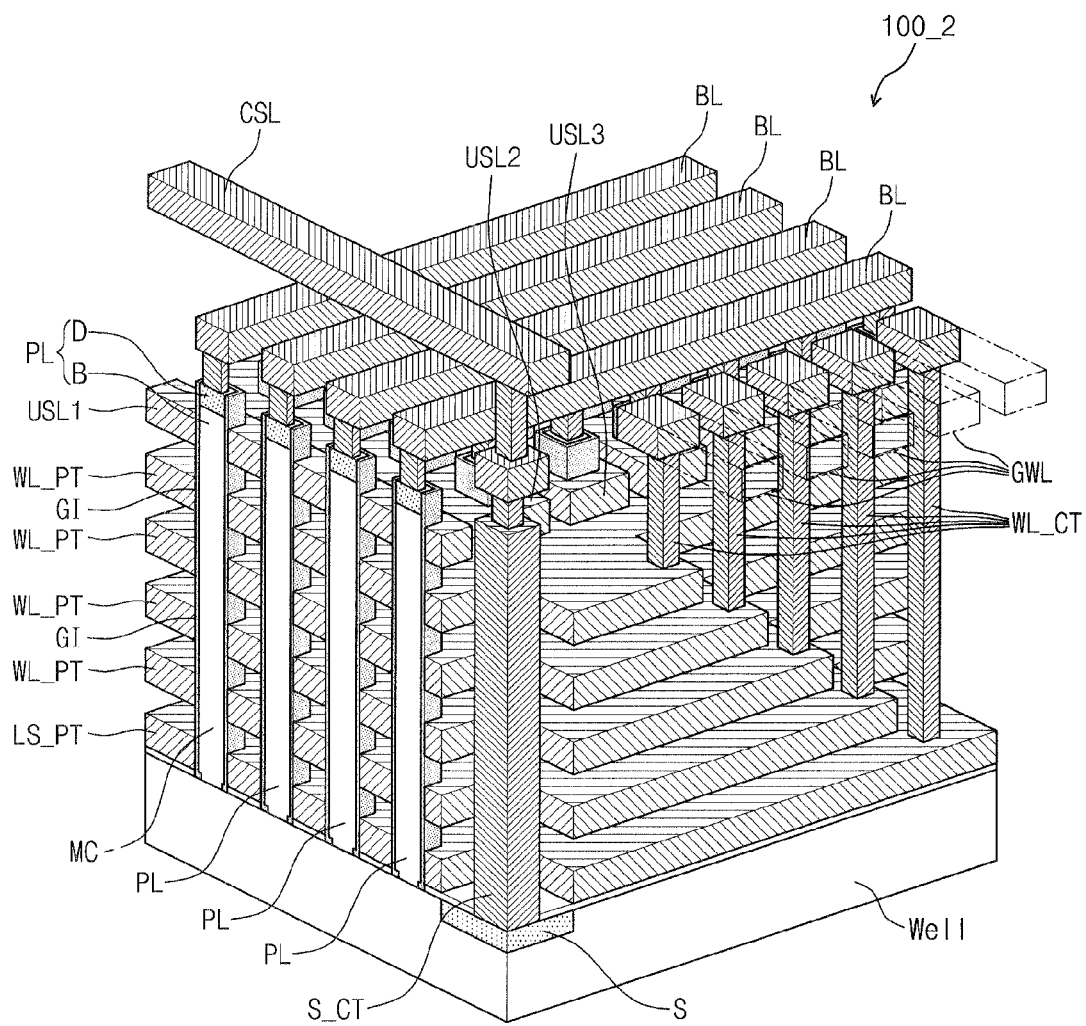
FIG. 15 is a view illustrating a structure of a memory cell array according to an exemplary embodiment of the inventive concept.

FIG. 15 is a view illustrating a structure of a memory cell array according to an exemplary embodiment of the inventive concept. A cell array 100_2 of a three-dimensional flash structure is exemplarily shown in FIG. 15.

Referring to FIG. 15, the cell array 100_2 of the three-dimensional flash structure may include a plurality of electrically-separated word line plates WL_PT and a plurality of active pillars PL (or active regions) arranged crossing over the plurality of word line plates WL_PT. Additionally, a semiconductor substrate may include a well region Well and a source region S. The source region S may be formed with a different conductive type than the well region Well. For example, the well region Well may consist of a p-type silicon and the source region S may consist of an n-type silicon. In an exemplarily embodiment of the inventive concept, the well region Well may be surrounded by at least one another well region (not shown) having a different conductive type than the well region Well so that they constitute a pocket well structure or a triple well structure.

Each of the word line plates WL_PT may consist of a plurality of local word lines LWL connected electrically on the same plane to be equipotential. Each of the word line plates WL_PT may be electrically insulated from each other through an interlayer insulation layer (not shown). The word line plates WL_PT may be respectively connected to electrically isolated global word lines GWL through word line contacts WL_CT. The word line contacts WL_CT may be formed at edges of the memory cell array or array blocks and also, areas of the word line plates WL_PT and positions where the word line contacts WL_CT are disposed may vary.

Each of the active pillars PL may include a body part B adjacent to the well region Well and a drain region D adjacent to an upper selection line USLi (i is an integer less than or equal to N). The body part B may consist of the same conductive type as the well region Well and the drain region D may consist of a different conductive type than the well region Well. The plurality of active pillars PL may have major axes in a direction penetrating the plurality of word line plates WL_PT. Intersection points between the plurality of word line plates WL_PT and the plurality of active pillars PL may be three-dimensionally distributed. In other words, each of the three-dimensional memory cells MC may be formed by the three-dimensionally distributed intersection points. A gate insulation layer GI may be disposed between the word line plate WL_PT and the active pillar PL. In an exemplary embodiment of the inventive concept, the gate insulation layer GI may be multilayered and for example, may be a stacked layer of Oxide-Nitride-Oxide (ONO). Some layers of the gate insulation layer GI may be used as a thin layer (e.g., a charge storage thin film or a charge storage layer).

One set of ends of the active pillars PL may be commonly connected to the well region Well and the other set of ends may be connected to a plurality of bit lines BL. A plurality (e.g., the N number) of active pillars PL may be connected to one bit line BL. Therefore, a plurality (e.g., the N number) of cell strings may be respectively connected to one bit line BL. Moreover, one active pillar PL may include one cell string CSTR. One cell string CSTR may include a plurality of memory cell MCs formed in the plurality of word line plates WL_PT. One memory cell MC may be defined by one active pillar PL and one local word line LWL or the word line plate WL_PT.

To program each memory cell MC and read programmed data, one cell string CSTR (e.g., one active pillar PL) is separately selected. For this, a plurality of the upper selection lines USLi may be disposed between the bit lines BL and the uppermost word line plate WL_PT. The upper selection lines USLi may be disposed intersecting the bit lines BL. The bit lines BL may be electrically connected to the drain region D through a predetermined plug and may directly contact the drain region D.

A plurality of upper selection transistors for controlling an electrical connection between a corresponding active pillar PL and a corresponding bit line BL may be formed in an intersection region of the plurality of bit lines BL and the plurality of upper selection lines USLi. Each upper selection transistor may be connected to a corresponding upper selection line USLi. As a result, one active pillar PL (e.g., one cell string CSTR) may be independently selected by way of the one bit line BL and one upper selection line USLi connected thereto.

As shown in FIG. 15, the source region S forming an electric charge path to/from the bit line BL may be formed in the well region Well. The source region S may be electrically connected to a common source line CSL. A source contact plug S_CT penetrating the word line plates WL_PT may be interposed between the common source line CSL and the source region S. The common source line CSL may be disposed on the bit lines BL while connected to the source contact plug S_CT and may be formed of a metallic material. However, the common source line CSL may be diversely configured.

To control an electric charge path to/from the bit line BL, a plurality of lower selection lines LSL for controlling an electrical connection between the active pillars PL and the well region Well may be disposed between the well region Well and lowermost word line plate WL_PT. In an exemplary embodiment of the inventive concept, the plurality of lower selection lines LSL may constitute a lower selection plate LS_PT that is electrically equipotential. Each of the lower selection lines LSL is connected to a lower selection gate LSGi of a corresponding lower selection transistor so that it may control an electrical connection between a corresponding active pillar PL and the well region Well. The above mentioned erase method according to an exemplary embodiment of the inventive concept may be applied to the above flash memory of three-dimensional structure.

Figure 16:
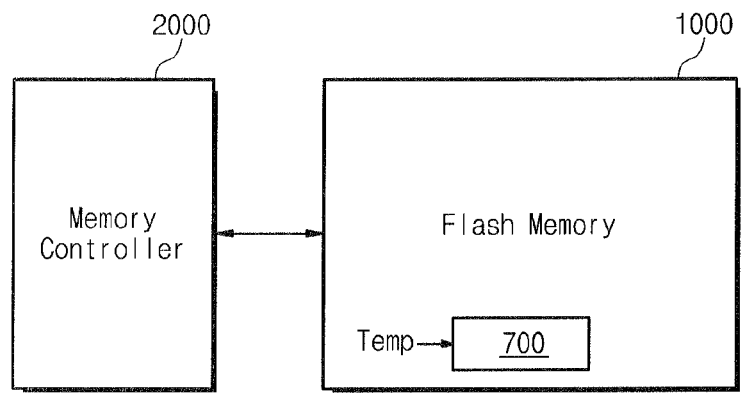
FIG. 16 is a block diagram of a memory system including a flash memory device according to an exemplary embodiment of the inventive concept.

FIG. 16 is a block diagram of a memory system including a flash memory device 1000 according to an exemplary embodiment of the inventive concept. The flash memory device 1000 may have the structure of the memory cell array 100 shown in FIG. 2 and also, the memory cell array 100 may include the stacked flash structure 100_1 shown in FIG. 14, the three-dimensional flash structure 100_2 shown in FIG. 15, and the flash structure without a source and a drain (not shown), or the pin-type flash structure (not shown).

Referring to FIG. 16, the memory system may include the flash memory device 1000 and a memory controller 2000. A configuration of the flash memory device 1000 is substantially the same as that of FIG. 1. Therefore, most overlapping descriptions will be omitted. The memory controller 2000 may be configured to control the flash memory device 1000. The flash memory device 1000 may include a control logic 700 therein to control operations of the flash memory device 1000 in response to the temperature detection result Temp. The control logic 700 may be substantially the same as that of FIG. 1. The control logic 700 may selectively change an erase operation condition (for example, the length of delay time, counter pulse, and a level of a word line voltage applied during an erase operation) in response to the temperature detection result Temp. The temperature detection result Temp may be obtained by substantially the same means discussed above with reference to FIG. 1. The erase method according to an exemplary embodiment of the inventive concept may be employed by the memory system of FIG. 16.

The memory system shown in FIG. 16 may constitute a memory card and/or a memory card system. In this case, the memory controller 2000 may be configured to communicate with the external (e.g., a host) through various interface protocols such as universal serial bus (USB), multimedia card (MMC), peripheral component interconnect express (PCI-E), Advanced Technology Attachment (ATA), serial-ATA, parallel-ATA, small computer system interface (SCSI), enhanced small disk interface (ESDI), or Integrated Drive Electronics (IDE). The flash memory device 1000 is a nonvolatile memory device that retains stored data in the absence of power. Due to this characteristic, the flash memory device 1000 may be used for storing data and code that needs to be or is desired to be kept when power is removed. The flash memory device 1000 having the above characteristic may be used for mobile devices such as a cellular phone, a personal digital assistant (PDA), a digital camera, a portable game console, and an MP3 player, and home/business applications such as a high-definition television (HDTV), a digital versatile disc (DVD), and a router, and a global positioning system (GPS).

Figure 17:
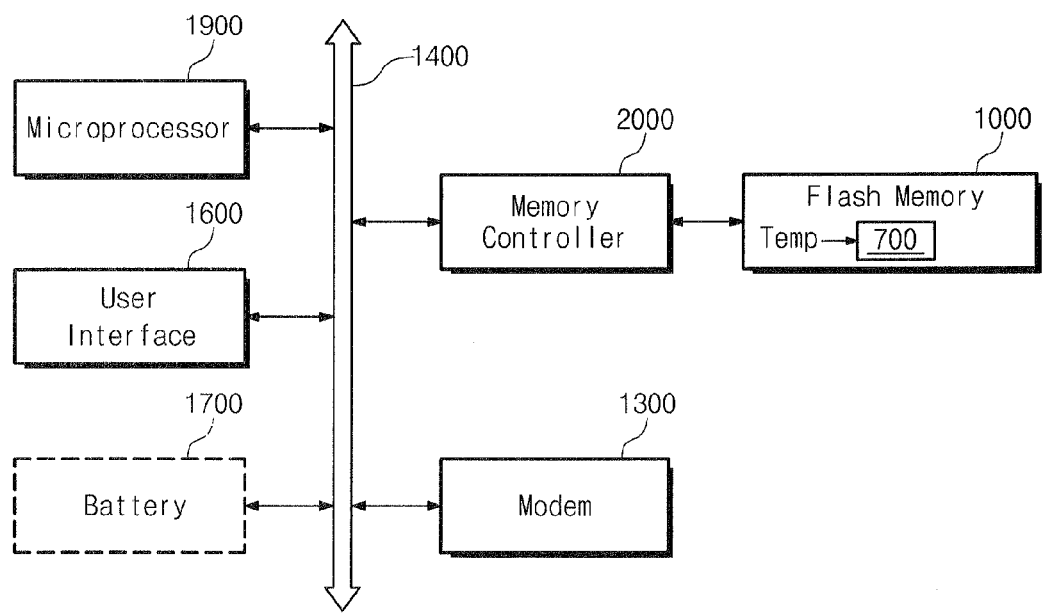
FIG. 17 is a block diagram of a computing system including a flash memory device according to an exemplary embodiment of the inventive concept.

FIG. 17 is a block diagram illustrating a computing system including the flash memory device 1000 according to an exemplary embodiment of the inventive concept.

Referring to FIG. 17, the computing system may include the flash memory device 1000, a memory controller 2000, a modem 1300 such as a baseband chipset, a user interface 1600, and a microprocessor 1900, which are electrically connected to a bus 1400.

The flash memory device 1000 of FIG. 17 may be substantially the same as that of FIG. 1. The flash memory device 1000 may have the structure of the memory cell array 100 shown in FIG. 2 and also, the memory cell array 100 may include the stacked flash structure 100_1 shown in FIG. 14, the three-dimensional flash structure 100_2 shown in FIG. 15, and the flash structure without a source and a drain (not shown), or the pin-type flash structure (not shown).

The memory controller 2000 may be configured to control the flash memory device 1000. The flash memory device 1000 may store M-bit data (M is an integer greater than or equal to 1) by a page unit, which are processed/to be processed by the microprocessor 1900, through the memory controller 2000. Moreover, the data stored in the flash memory device 1000 may be erased by a block unit consisting of a plurality of pages in response to a control of the memory controller 2000.

The flash memory device 1000 may include a control logic 700 therein, which controls operations of the flash memory device 1000 in response to the temperature detection result Temp. The control logic 700 is substantially the same as that shown in FIG. 1 and may selectively change an erase operation condition (for example, the length of delay time, counter pulse, and a level of a word line voltage applied during an erase operation) in response to the temperature detection result Temp. The temperature detection result Temp may be obtained by substantially the same means discussed above with reference to FIG. 1. The erase method according to an exemplary embodiment of the inventive concept may be employed by the computing system of FIG. 17.

If the computing system of FIG. 17 is a mobile device, a battery 1700 may be additionally provided to supply an operating voltage of the computing system. Although not shown in the drawings, an application chipset, a camera image processor (CIS), a mobile dynamic random access memory (DRAM), etc. may be further provided in the computing system. The memory controller 2000 and the flash memory device 1000 may constitute a solid state drive/disk (SSD) using a nonvolatile memory for storing data.

The flash memory device 1000 and/or the memory controller 2000 may be packaged using various forms of packages. For example, the flash memory device 1000 and/or the memory controller 2000 may be packaged in packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline (TSOP), system in package (SIP), multi chip package (MCP), wafer-level fabricated package (WFP), wafer-level processed stack package (WSP), etc. In an exemplary embodiment of the inventive concept, memory cells may be realized using one of various cell structures with a charge storage layer. The cell structure having a charge storage layer may include the CTF structure using a charge trap layer, a stacked flash structure (where arrays are stacked in multiple layers), a flash structure without sources and drains, a pin-type flash structure, and a three-dimensional flash structure.

According to an exemplary embodiment of the inventive concept, an erase operation condition is selectively changed according to a change of temperature. Therefore, electrons/holes in a charge storage layer are permitted to be sufficiently stabilized during an erase operation at a cold temperature, such that a subsequent erase verify operation may be performed at the right time. As a result, high erase accuracy and stable performance may be secured in an operating environment of a cold temperature, and also life shortening of a CTF memory device due to repeated erase loops may be prevented.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An erase method of a charge trap flash memory device, the method comprising:
   receiving a temperature detection result; and
   performing an erase operation based on the temperature detection result,
   wherein the erase operation includes an erase execution interval, an erase verify interval and a delay time between the erase execution interval and the erase verify interval, wherein the erase operation changes a level of a word line voltage applied to word lines during the erase execution interval, a length of the delay time, or a level of the word line voltage applied to the word lines during the delay time,
   wherein changing the length of the delay time comprises increasing the length of the delay time in response to the temperature detection result being lower than a reference voltage.

2. The method of claim 1, wherein the length of the delay time increases as the temperature detection result decreases.

3. An erase method of a charge trap flash memory device, the method comprising:
   receiving a temperature detection result; and
   performing an erase operation based on the temperature detection result,
   wherein the erase operation includes an erase execution interval, an erase verify interval and a delay time between the erase execution interval and the erase verify interval, wherein the erase operation changes a level of a word line voltage applied to word lines during the erase execution interval, a length of the delay time, or a level of the word line voltage applied to the word lines during the delay time,
   wherein changing the level of the world line voltage applied to the word lines during the delay time comprises applying a counter pulse to the word lines during the delay time in response to the temperature detection result being lower than a reference voltage.

4. The method of claim 3, wherein an applying time and a voltage level of the counter pulse change according to the temperature detection result.

5. The method of claim 3, wherein an applying time of the counter pulse increases as the temperature detection result decreases.

6. The method of claim 3, wherein a voltage level of the counter pulse increases as the temperature detection result decreases.

7. The method of claim 3, wherein the counter pulse forms an electric field in a direction opposite to a direction of an electric field formed in the erase execution interval.

8. The method of claim 1, wherein changing the level of the word line voltage applied to the word lines during the erase execution interval comprises applying a negative voltage to the word lines during the erase execution interval in response the temperature detection result being lower than a reference voltage.

9. The method of claim 8, wherein an applying time and a voltage level of the negative voltage change according to the temperature detection result.

10. The method of claim 9, wherein the applying time of the negative voltage increases as the temperature detection result decreases.

11. The method of claim 9, wherein the negative voltage increases in a negative direction as the temperature detection result decreases.

12. The method of claim 1, wherein the temperature detection result is inputted from the outside of the charge trap flash memory device or internally generated by the charge trap flash memory device.

13. A charge trap flash memory device, comprising:
   a memory cell array including a plurality of memory cells, wherein a memory cell uses an insulation layer as a charge storage layer; and
   a control logic controlling an erase operation performed on the memory cells in response to a temperature detection result,
   wherein the erase operation includes an erase execution interval, an erase verify interval and a delay time between the erase execution interval and the erase verify interval, wherein the erase operation changes a level of a word line voltage applied to word lines connected to memory cells to be erased during the erase execution interval, a length of the delay time, or a level of the word line voltage applied to the word lines during the delay time,
   wherein the control logic controls the length of the delay time to increase when the temperature detection result is lower than a reference voltage.

14. A charge trap flash memory device, comprising:
   a memory cell array including a plurality of memory cells, wherein a memory cell uses an insulation layer as a charge storage layer; and
   a control logic controlling an erase operation performed on the memory cells in response to a temperature detection result,
   wherein the erase operation includes an erase execution interval, an erase verify interval and a delay time between the erase execution interval and the erase verify interval, wherein the erase operation changes a level of a word line voltage applied to word lines connected to memory cells to be erased during the erase execution interval, a length of the delay time, or a level of the word line voltage applied to the word lines during the delay time,
   wherein the control logic controls the level of the word line voltage applied to the word lines during the delay time by causing a counter pulse to be applied to the word lines during the delay time when the temperature detection result is lower than a reference voltage; and
   the counter pulse forms an electric field in a direction opposite to a direction of an electric field formed in the erase execution interval.

15. The charge trap flash memory device of claim 13, wherein the control logic controls the level of the word line voltage applied to the word lines during the erase execution interval by causing a negative voltage to be applied to the word lines during the erase execution interval when the temperature detection result is lower than a reference voltage.

16. The charge trap flash memory device of claim 13, wherein the memory cell array includes a stacked flash structure in which a plurality of memory cell arrays are stacked in a plurality of layers, a flash structure without a source and a drain, a pin-type flash structure, or a three-dimensional flash structure.

* * * * *